United States Patent
Eichler et al.

(10) Patent No.: US 8,968,837 B2
(45) Date of Patent: Mar. 3, 2015

(54) METHOD FOR THE PLASMA-ENHANCED TREATMENT OF INTERNAL SURFACES OF A HOLLOW BODY, FLUID SEPARATOR, AND USE THEREOF

(71) Applicant: Fraunhofer-Gesellschaft zur Foerderung der Angewandten Forschung E.V., Munich (DE)

(72) Inventors: Marko Eichler, Braunschweig (DE); Krees Nagel, Braunschweig (DE); Claus-Peter Klages, Braunschweig (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 58 days.

(21) Appl. No.: 13/666,575

(22) Filed: Nov. 1, 2012

(65) Prior Publication Data

US 2013/0129582 A1    May 23, 2013

Related U.S. Application Data

(63) Continuation of application No. PCT/EP2011/001993, filed on Apr. 19, 2011.

(30) Foreign Application Priority Data

May 3, 2010   (DE) .......................... 10 2010 018 981

(51) Int. Cl.
| | | |
|---|---|---|
| *B05D 5/00* | (2006.01) | |
| *B01D 17/02* | (2006.01) | |
| *B05D 1/00* | (2006.01) | |
| *B05D 7/22* | (2006.01) | |
| *C23C 16/04* | (2006.01) | |
| *C23C 16/507* | (2006.01) | |
| *B01L 3/00* | (2006.01) | |
| *B05D 5/08* | (2006.01) | |

(52) U.S. Cl.
CPC ............. *B05D 5/00* (2013.01); *B01D 17/0202* (2013.01); *B05D 1/62* (2013.01); *B05D 7/22* (2013.01); *C23C 16/045* (2013.01); *C23C 16/507* (2013.01); *B01L 3/502707* (2013.01); *B01L 3/502753* (2013.01); *B05D 5/083* (2013.01)
USPC ............ 427/569; 427/230; 427/237; 427/238

(58) Field of Classification Search
None
See application file for complete search history.

(56) References Cited

U.S. PATENT DOCUMENTS

| | | | |
|---|---|---|---|
| 2003/0019506 A1* | 1/2003 | Kutsch et al. .................. | 134/1.1 |
| 2005/0176230 A1* | 8/2005 | Sieber et al. .................. | 438/609 |
| 2009/0304549 A1 | 12/2009 | Coulson | |

FOREIGN PATENT DOCUMENTS

| | | |
|---|---|---|
| DE | 10337097 A1 | 8/2004 |
| DE | 102006036536 B3 | 2/2008 |
| WO | 0211888 A2 | 2/2002 |

OTHER PUBLICATIONS

English translation of the International Preliminary Report on Patentability and Written Opinion of the International Searching Authority mailed on Nov. 15, 2012 in connection with International Patent Appln. Ser. No. PCT/EP2011/001993 filed on Apr. 19, 2011.
International Search Report and Written Opinion issued on Jul. 14, 2011, in connection with PCT Application No. PCT/EP2011/001993.

* cited by examiner

*Primary Examiner* — Joseph Miller, Jr.
(74) *Attorney, Agent, or Firm* — Gesmer Updegrove LLP

(57) ABSTRACT

The present invention relates to the treatment of internal surfaces of a hollow body, on the inner surfaces of which areas having different surface properties, for example, having hydrophilic and hydrophobic properties, are produced. The invention further relates to fluid separators that are based on said hollow bodies and that have areas having different surface properties. Such fluid separators are used in medical technology and analysis, in particular biochemical analysis.

11 Claims, No Drawings

METHOD FOR THE PLASMA-ENHANCED TREATMENT OF INTERNAL SURFACES OF A HOLLOW BODY, FLUID SEPARATOR, AND USE THEREOF

PRIORITY INFORMATION

The present invention is a continuation of International Application No. PCT/EP2011/001993, filed on Apr. 19, 2011 that claims priority to DE Application No. 102010018981.2 filed on May 3, 2010, which are incorporated herein by reference in their entireties.

BACKGROUND OF THE INVENTION

The present invention relates to the treatment of the inside surfaces of a hollow body, such that areas of different surface properties, e.g., with hydrophilic and hydrophobic properties, are created on the inside surfaces of said hollow body. In addition, the invention relates to fluid separators which are based on these hollow bodies and have areas of differing surface properties. Such fluid separators are used in medical technology and analysis, in particular in biochemical analysis.

As a rule, channel-shaped systems in which opposing surfaces have different surface properties in the channel are usually used for the implementation of separators for microfluidic applications. The fluid to be separated is introduced into the separator and can then be separated on the basis of different interactions of the fluid components to be separated with the respective surfaces.

WO 02/011888 discloses a microfluidic system, in which said system is composed of various layers of material, each having recesses which join together to form a channel-shaped recess when the layers are stacked. The surface properties can be influenced in the areas of the channel by selecting appropriate materials for the individual layers.

US 2009/0282978 describes microfluidic separators, in which the separation is accomplished by using membranes in microfluidic systems.

SUMMARY OF THE INVENTION

Against this background, the object of the present invention was to provide fluid separators which permit simpler production than is possible according to the prior art, while at the same time having a high separation efficiency.

This object is achieved by the method for plasma-supported treatment of inside surfaces of a hollow body having the features of claim 1 and by the fluid separator having the features of claim 12. Inventive applications are defined in claim 16. The additional dependent claims exhibit advantageous refinements.

According to the invention, a method is provided for plasma-supported treatment of the inside surfaces of a hollow body in which a first gas stream and at least one additional gas stream are introduced into the hollow body, such that the gases in the hollow body are not thoroughly mixed, so that a first area of the inside surface is surrounded essentially by the first gas stream and at least one additional area of the inside surface is surrounded essentially by the at least one additional gas stream. By applying an alternating electric field, a plasma discharge of at least the first gas forming the first gas stream is ignited, so that a surface treatment is performed in the first area of the inside surface, resulting in a different surface property from the surface property in the other areas of the inside surface. It is also possible that through the alternating electric field not only is a plasma discharge of the first gas ignited, but also plasma discharges of the additional gases introduced into the hollow body are ignited.

It is preferable for the gas pressure, i.e., the total gas pressure in the hollow body, to be in the range of 0.8 to 3 bar, in particular from 1.0 to 1.5 bar.

The frequencies of the electric alternating field are preferably in the range of 10 Hz to 5.8 GHz, in particular from 1 kHz to 100 kHz. It is also possible for the alternating field to be pulsed. The preferred cycle time is in the range of 1 msec to 1000 msec, especially preferably in the range of 100 msec to 10 sec. Within the context of the present invention, alternating fields should be understood to include not only sinusoidal voltage curves but also other voltage curves, such as square-wave curves, unipolar or bipolar pulses and mixed forms thereof.

The plasma discharge is preferably a dielectric barrier discharge.

The surface treatment is preferably a coating of the inside surface of the hollow body. Likewise, however, it is also possible to perform a surface modification on the inside surface of the hollow body, in particular an oxidation, an activation, a chemical functionalization and/or an etching.

There is basically no restriction with regard to the gases to be introduced as long as they are suitable for a plasma treatment. Thus non-coating gases in atomic form, in particular noble gases, e.g., argon, and molecular gases, in particular oxygen, nitrogen, halogen, sulfur hexafluoride or other diatomic or triatomic volatile gases may also be used. It is also possible that gases from the group of coating gases are used. These include, for example, hydrocarbons, fluorohydrocarbons, organosilicon compounds, in particular alkyl silanes, alkyl disilanes, siloxanes, silazanes and silicic acid esters. In addition, functional oxygen-containing organic compounds, in particular ethers, aldehydes, ketones and carboxylic acids as well as functional nitrogenous organic compounds, in particular amines and nitriles as well as heterocycles can also be mentioned here. It is likewise possible to use mixtures of the gases listed above.

According to another preferred variant, the first gas and the at least one additional gas have different ignition voltages for the plasma discharge. In this way, it is possible for only the discharge of one gas to be ignited when the electric alternating field is applied while the gas or the additional gases do not lead to a plasma discharge because of their higher ignition voltage.

Another variant provides for the first gas and/or the at least one additional gas to contain at least one precursor. It is possible in this case to use carrier gases, to which precursors are added, so that only after the plasma has formed do these precursors produce the compounds which are then deposited on the surfaces. Different precursors may be used, depending on which layer is to be deposited. When using oxidizing gases inside the hollow body, silicon oxide and/or metal oxides can be deposited from precursors containing silicon or metal. When the following precursors are used, the following layers can be obtained by using reducing or inert gases such as noble gases, nitrogen and mixtures thereof with hydrogen as the gas within the hollow body:

Hydrocarbons: amorphous hydrocarbon layers (a-C:H),
Fluorocarbons and fluorohydrocarbons: fluorinated carbons and/or hydrocarbons (a-C:F and a-C:F:H),
precursors containing silicon such as, for example, tetramethylsilane (TMS), hexamethyldisilane (HMDS), hexamethyldisiloxane (HMDSO) or hexamethylsilazane (HMDSN): Si-containing plasma polymers, Precursors which have suitable functional groups (hydroxy, amino, epoxy, carboxyl, oligoethylene oxide) and can be polymerized with methacrylic acid, acrylic acid, allyl, vinyl and other free radicals: plasma polymers with the functional groups listed above, in particular in pulsed operation of the discharge.

It is also preferable for laminar gas flows of the first gas and the additional gases to prevail in the areas in which a plasma discharge occurs in the hollow body.

The plasma discharge is preferably a cavity partial discharge in the interior of the hollow body. It may be homogenous or filamented.

According to the invention, a fluid separator containing a hollow body having at least one channel-type branch is also made available. The inside surface of the hollow body here has a first area and at least one additional area. The individual areas differ with regard to their surface properties. At least one of the areas of the inside surface of the hollow body has a coating produced by means of a plasma process.

Liquid two-phase system such as those used in drip-based systems in microfluidics can be separated by the different surface properties of the inside surface of the hollow body. If the body has a hydrophobic area and a hydrophilic area of the inside surface, then the hydrophilic phase will wet the hydrophilic area of the inside surface and the two-phase system will begin to separate and can be separated through the hollow body, which is divided into a hydrophilic area and hydrophobic area. In particular V-shaped branches of channels are recommended here. The special advantage of the present fluid separator is that the surface properties can be varied accordingly in the hollow body and need not be varied only after the branch into different channels. This allows a much better separation efficiency.

In comparison with microfluidic systems for separation based on wet chemical coatings on the inside surface, the inventive separator is much simpler to manufacture. Furthermore, much thinner layers can be achieved on the inside surfaces of the hollow body according to the invention, which allows larger channel diameters in the microfluidic system.

The fluid separators according to the invention are used in particular in the area of medical technology and analysis, and here in particular in biochemical analysis.

EXAMPLE

A fluid separator with a thickness of 2.8 mm in which a channel K0 with a cross section of 300 µm×300 µm, which is split in the form of a V into two channels V1 and V2 having a cross section of 250 µm×250 µm, is coated. Argon with 1 vol % octafluorocyclobutane ($C_4F_8$) is fed into channel V1 with a total gas pressure of 1.05 mbar. At the same time, the channel V2 is flushed with 0.01 L/min sulfur hexafluoride ($SF_6$). The gas flows of channels V1 and V2 travel in the direction of channel V0 and form a laminar gas flow at the transition to channel V0. On the separator two metallic electrodes are applied in the area of the branch. At an electrode voltage (tip to tip) of 25 $kV_{ss}$, a discharge is ignited in the area in the channel V0 and in the channel V1, through which the argon gas mixture flows, so that the channel V1 is coated entirely and the channel V0 is coated on one side in the area of the branch. The other side of the channel V0 and the channel V2 are protected by the quenching gas $SF_6$, which has a higher ignition voltage than the argon mixture. The treatment time is 60 sec. After the coating, the channel V1 and the adjacent side of the channel V0 near the branch have a hydrophobic coating. The hydrophilic channel surfaces of the channel V2 and the corresponding side of the channel V0 near the branch were not coated and were still hydrophilic after the treatment. If the separator is operated with a segmented flow of water and hexadecane, the flow from the inlet into channel V0 is separated at the branch to V1 and V2, where the hexadecane flows into the channel V1 and the water flows into the channel V2.

What is claimed is:

1. A method for plasma-supported treatment of inside surfaces of a hollow body, in which a first gas forming a first gas stream and at least one additional gas forming at least one additional gas stream are introduced into the hollow body in such a way that the gases are not mixed completely in the hollow body, so that a first area of the inside surface is essentially surrounded by the first gas stream, and at least one additional area of the inside surface is surrounded essentially by the at least one additional gas stream, and at least one plasma discharge of the first gas is ignited by applying an alternating electric field, so that a surface treatment is performed in the first area of the inside surface, so that the surface properties there differ from the surface properties on the other areas of the inside surface.

2. The method according to claim 1, wherein the gas pressure in the hollow body is in the range of 0.8 to 3 bar, in particular 1.0 to 1.5 bar.

3. The method according to claim 1, wherein the frequencies of the electric alternating field are in the range of 10 Hz to 5.8 GHz, in particular from 1 kHz to 100 kHz.

4. The method according to claim 1, wherein the plasma discharge is a dielectric barrier discharge.

5. The method according to claim 1, wherein the surface treatment is a surface modification, in particular an oxidation, activation, chemical functionalization and/or etching or coating.

6. The method according to claim 1, wherein the first gas and the at least one additional gas are selected, independently of one another, from the group of non-coating gases in atomic form consisting of noble gases, as well as from the group of non-coating gases in molecular form, in.

7. The method according to claim 1, wherein the first gas and the at least one additional gas are selected, independently of one another from the group of coating gases consisting of hydrocarbons, fluorohydrocarbons, organosilicon compounds, functional oxygen-containing organic compounds.

8. The method according to claim 1, wherein the first gas and the at least one additional gas have different ignition voltages for the plasma discharge.

9. The method according to claim 1, wherein the first gas and/or the at least one additional gas have at least one precursor, in particular selected from the group consisting of fluorohydrocarbons and silicon-containing precursors.

10. The method according to claim 1, wherein in the areas of the at least one plasma discharge, laminar gas flows prevail.

11. The method according to claim 1, wherein the at least one plasma discharge is a partial discharge in a cavity in the interior of the hollow body.

* * * * *